United States Patent [19]

Kuno et al.

[11] 3,943,463
[45] Mar. 9, 1976

[54] TUNABLE OSCILLATOR/AMPLIFIER CIRCUIT FOR MILLIMETER-WAVE DIODES

[75] Inventors: Hiromu J. Kuno, Palos Verdes Peninsula; David L. English, Garden Grove, both of Calif.

[73] Assignee: Hughes Aircraft Company, Culver City, Calif.

[22] Filed: Jan. 20, 1975

[21] Appl. No.: 542,527

Related U.S. Application Data

[63] Continuation of Ser. No. 331,416, Feb. 12, 1973, abandoned.

[52] U.S. Cl. .................. 331/107 R; 330/34; 330/56; 331/96
[51] Int. Cl.² .......................................... H03B 5/18
[58] Field of Search ............. 331/107 R, 107 G, 96; 330/34, 56

[56] References Cited
UNITED STATES PATENTS

| | | | |
|---|---|---|---|
| 3,524,149 | 8/1970 | Socci | 331/96 |
| 3,623,146 | 11/1971 | Kaneko | 331/96 |
| 3,639,856 | 2/1972 | Kimura | 331/96 |
| 3,646,357 | 2/1972 | Grace | 331/107 R |
| 3,792,374 | 2/1974 | Havens et al. | 331/101 |

OTHER PUBLICATIONS
Proc. IEEE, Aug. 1970, pp. 1285, 1286, R. S. Ying.

*Primary Examiner*—John Kominski
*Attorney, Agent, or Firm*—William J. Bethurum; W. H. MacAllister

[57] ABSTRACT

Disclosed is microwave oscillator or amplifier circuitry which is tunable over a wide bandwidth and which includes an improved variable loading on a negative resistance semiconductor diode, such as an IMPATT diode. This loading is provided in mutually perpendicular directions closely adjacent the diode. In one direction, a DC bias connection is mounted together with an adjustable coaxial filter thereon, and this filter serves as a series tuning element for the diode. A movable short is mounted for adjustment in a direction perpendicular to that of the above coaxial filter and provides parallel tuning for the diode. These series and parallel tuning elements are operative to match the real and imaginary components of the diode impedance to the real and imaginary components of the load impedance, respectively, at a particular operating frequency, thereby maximizing the power transfer and the DC to RF conversion efficiency of the circuitry. For ease of frequency adjustment, all of the frequency dependent parameters of the circuitry are contained in a removable and replaceable insert which fits securely into the waveguide housing.

12 Claims, 5 Drawing Figures

TUNABLE OSCILLATOR/AMPLIFIER CIRCUIT FOR MILLIMETER-WAVE DIODES

This is a continuation of application Ser. No. 331,416, filed Feb. 12, 1973, now abandoned.

FIELD OF THE INVENTION

This invention relates generally to microwave oscillators and amplifiers and more particularly to improved tuning structures for use with millimeter wave diodes connected in these oscillators and amplifiers.

BACKGROUND

As is well known, certain microwave oscillators and amplifiers commonly use a semiconductor diode, such as an IMPATT or a TRAPATT diode, as the negative resistance element of the circuit necessary for sustaining microwave or millimeter wave oscillations therein. Normally this diode is mounted at a selected location in the oscillator or amplifier waveguide structure and is provided with a suitable DC bias connection so that the diode will conduct current and sustain oscillations at millimeter wave or microwave frequencies when the diode impedance is properly matched to a load impedance. When using a two terminal negative resistance device such as an IMPATT diode, it is frequently desirable to provide two degrees of tuning for the circuit, which are commonly referred to as series and parallel tuning. This versatile tuning characteristic makes it possible to match the real and imaginary components of the diode impedance with those of the load impedance. The latter is desirable in order to achieve a maximum power transfer and a maximum DC to RF conversion efficiency for the oscillator or amplifier at a chosen frequency of operation.

PRIOR ART

Hitherto, various techniques have been used in order to achieve the above two degrees of tuning in microwave structures, such as microwave oscillators and amplifiers. One of these techniques utilizes a movable tuning short positioned in a waveguide structure at a selected location on one side of the diode and further utilizes one or more tuning screws on the other side of the diode. The tuning short and tuning screws are adjustable respectively in mutually perpendicular directions to provide the above series and parallel tuning for the oscillator or amplifier circuit.

The disadvantage of using this latter prior art approach in the fabrication of millimeter wave structures resides in the difficulty of making certain necessary fine tuning adjustments by turning the tuning screws in their respective threaded housings. For example, in order to make a desired small change in the loading on a diode, it becomes necessary to make a corresponding small change in the displacement of the tuning screw in the order of one mil (0.001 inch). Using the smallest available American standard screw size (No. 0-80) with 80 threads to the inch, it becomes necessary to critically turn the tuning screw approximately 1/10th of a turn in order to achieve this displacement variation at the end of the tuning screw. Additionally, the threaded openings in the waveguide housing for receiving these screws render this structure very lossy at millimeter wave frequencies.

Another structure for providing the above-described two degrees of tuning is the so-called E-H tuner which comprises a pair of mutually perpendicular movable shorts which are adjustably positioned in waveguide housings which intersect at a common junction. This junction is adapted for mounting adjacent the microwave diode for varying the loading of the diode in two directions as the circuit is tuned. However, the E-H tuner is also difficult to tune as a result of the fact that the mutually perpendicular shorts are moved mechanically toward and away from the diode by the use of a threaded screw, making this structure as difficult to fine tune as the above-described tuning screws per se. Furthermore, this E-H tuner structure generally provides very narrow band tuning as a result of the fact that it is not normally possible to mount these two mutually perpendicular shorts closely adjacent to the diode to achieve maximum tuning sensitivity.

THE INVENTION

The general purpose of this invention is to provide a novel and alternative approach to the above prior art tuning schemes and one which possesses most, if not all, of the advantages of these prior art approaches, while possessing none of their aforedescribed significant disadvantages. To attain this purpose, we have provided a tunable structure for sustaining microwave oscillations, including a waveguide in which a negative resistance diode is mounted and a DC bias connector which extends through an opening in a waveguide member opposite the diode for providing a DC bias voltage to the latter. This structure features a novel tuning arrangement including a hollow RF filter member which is mounted coaxially with the bias connector and is adjustably disposed within the opening of the waveguide member, so that the filter member may be moved within this opening to vary the series loading on the diode. The DC bias connector provides the dual purpose of connecting a DC bias voltage to the diode while also serving as a slidable mount for the coaxial filter. This filter provides the dual purpose of RF filtering and series tuning the diode, and it combines with a movable waveguide short on the other side of the diode to impart both series and parallel tuning to the structure. Advantageously, a replaceable insert is used for the above waveguide member and it includes therein all of the frequency dependent parameters of the waveguide circuitry. Thus, the operating frequency of the circuitry can be changed merely by replacing this insert and without any further modification of the remaining waveguide structure.

Accordingly, an object of the present invention is to provide a new and improved tunable waveguide structure which exhibits an improved tuning capability.

Another object is to provide a waveguide structure of the type described which is operable over a wide frequency band to tune and match the real and imaginary components of a diode impedance with the real and imaginary components of an external load impedance thereon at a particular operating frequency.

Another object is to provide an improved waveguide structure of the type described which is economical of construction, reliable in operation, and which lends itself to rapid fabrication in production quantities.

A feature of the present invention is the provision of a tuning element which is coaxial with a DC bias connector for the diode. The bias connector serves as a slidable mount for this surrounding coaxial tuning element which doubles as the necessary RF filter to keep RF out of the bias supply. This feature serves to minimize the structural requirements for the waveguide assembly.

Another feature of this invention is the utilization of anodized aluminum coating ($Al_2O_3$) on the surface of this coaxial tuning element for providing a suitable insulation between the DC bias connector and the opening into which the coaxial element is mounted. This insulating technique also minimizes fabrication costs and does not require a separate insulating member between the DC bias connector and the adjacent waveguide metal.

Another feature of the present invention is the provision of a replaceable frequency control insert member which is constructed to receive the DC bias connector, the coaxial tuning member, and a movable short. This member includes a step transformer at one end thereof and a groove of predetermined depth extending from the transformer to the other end thereof; and the depth of this groove and the geometrical configuration of the transformer establish the particular operating frequency of the microwave structure. This frequency may be readily changed by replacing this frequency control insert member with another insert member of different step transformer and groove configuration.

A still further feature of this invention resides in the mounting of a portion of the diode package beneath one surface area of a diode heat sink. This heat sink forms one wall of the wave guiding structure of the assembly, and this mounting serves to minimize electrical discontinuities on the latter surface which otherwise would tend to generate spurious modes of oscillation. The spurious effects of electrical discontinuities on the waveguiding surfaces (such as an abrupt step or gap therein) are large at millimeter wavelengths.

These and other objects and features of the invention will become more fully apparent in the following detailed description of the accompanying drawings.

DRAWING

Figure 1:
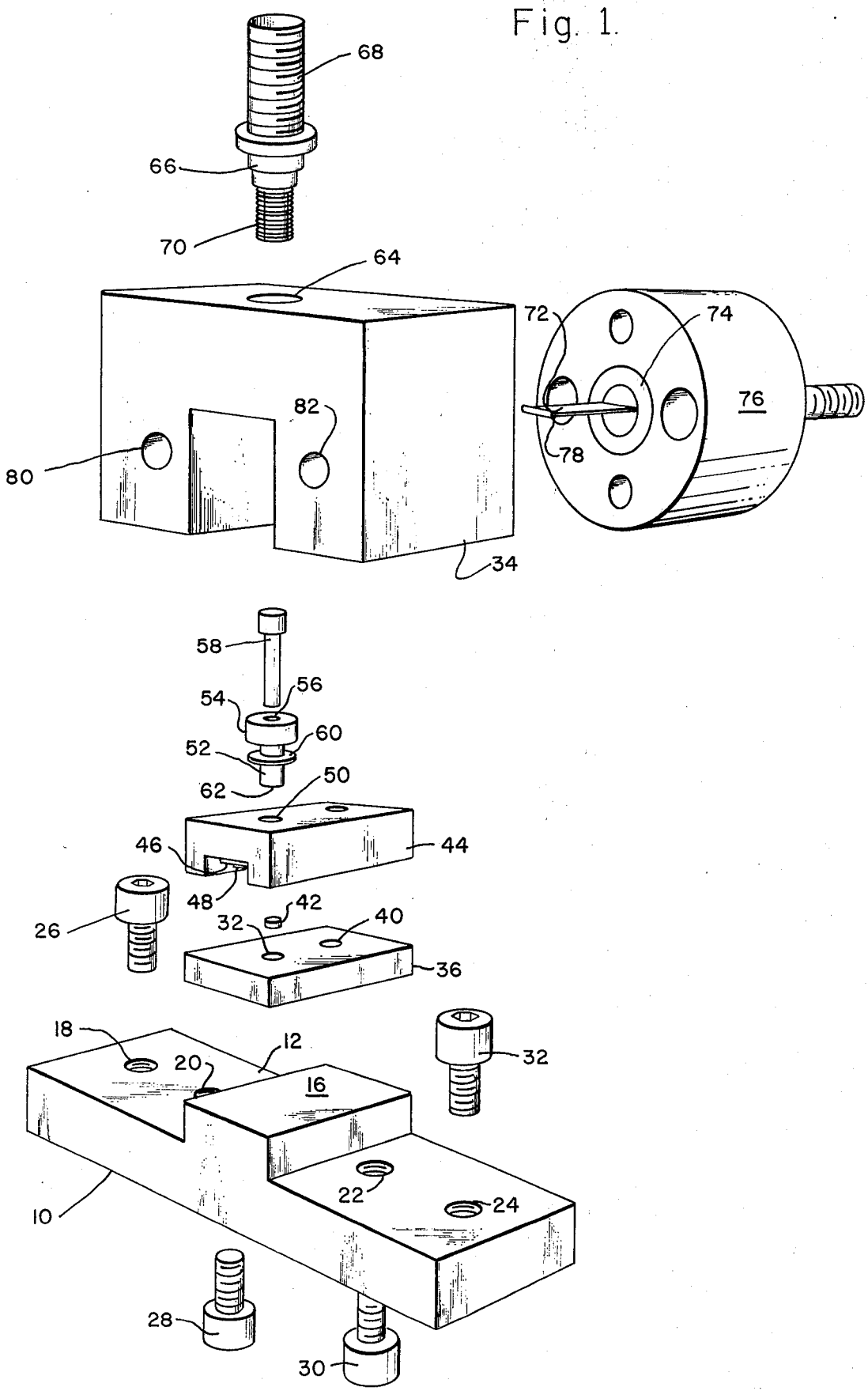
FIG. 1 is an exploded isometric view of the waveguide structure embodying the invention.

Referring now to the drawings, there is shown in FIG. 1 a waveguide base support member 10 having a pair of shoulders 12 and 14 on opposite sides of an elevated mounting pedestal 16. This member 10 is machined from a suitable metal, such as brass, and it further includes two pairs of openings 18, 20, 22, and 24 as shown for receiving mounting screws 26, 28, 30, and 32, respectively.

The outer mounting screws 26 and 32 are for the purpose of securing the waveguide assembly to an external support member (not shown), whereas the two inner mounting screws 28 and 30 serve to secure the base support member 10 to the cover member 34 which will be described further below.

The pedestal 16 is adapted to support a metal heat sink 36 of like configuration and having a pair of recesses or nests 38 and 40 therein, one of which receives a bottom diode contact and heat sink 36 for the diode package 42 to be described in further detail below (See FIG. 3). This bottom contact 96 for the diode package 42 is configured to fit into one of these recesses 38 in the assembled condition of the waveguide structure described, and the upper surface of the lower disc contact 96 of this diode package 42 lies in the same plane as the upper surface of the heat sink 36. As a result, the electrical discontinuities in the waveguide which is formed in part by this surface are minimized.

A replaceable metal insert 44 is the frequency determining member of the waveguide structure and is of identical overall length and width as the heat sink 36. The insert 44 is adapted to rest on the upper surface of the heat sink 36, and these two members define the geometry of the waveguide walls of the structure described. The member 44 includes a step transformer 46 at one end thereof, and a groove 48 of predetermined depth in the lower surface of the member 44 extends from the transformer 46 to the other end of the member 44. The geometries of the groove 48 and the transformer 46 determine the operating frequency of the waveguide structure. The insert 44 further includes a cylindrical passageway 50 which is adapted to receive a hollow anodized aluminum sleeve 52 which serves both as the RF filter and the coaxial tuner for the waveguide structure of the invention. The sleeve 52 is integrally joined with an upper cap portion 54, and an opening 56 extends longitudinally through the cap 54 and sleeve 52 to accommodate a DC bias pin 58 which extends through this opening and makes electrical connection to the diode package 42 resting within the recess 38.

The particular geometrical configuration of the step transformer 46 and the groove 48 sets the operating frequency for the waveguide assembly; thus, all of the frequency dependent substructures of the assembly are contained within this single replaceable insert member 46. This member 46 may be readily removed from the assembly and replaced with a different insert of the same overall shape but which is configured for a different operating frequency, and this may be done without the requirement for any machining or other modification of the remaining waveguide structure. Furthermore, one one or more thin flat annular spacers 60, on the order of 1–20 mils in thickness, are used to control the distance from the lower end 62 of the sleeve 52 to the diode package 42, and in this manner the diode within the package 42 can be series tuned in very small calibration steps without the use of a tuning screw. This fine tuning technique has particular advantage over the relatively coarse tuning provided by the tuning screws of the prior art as mentioned above.

A solid inverted U-shaped top housing cover 34 fits as indicated around the previously described members 16, 36, and 44 when these members are stacked adjacent one another in the assembled condition of the structure. In this assembled condition, the bias pin 58 partially extends into the opening 64 within the cover 34 and there makes electrical contact with one end 66 of the external bias connector 68. A bellows seal 70 is adapted to fit around the end 66 of the external bias pin 68, and this bellows seal 70 may be fabricated of any suitable metal, such as brass. This seal may advantageously be soldered directly to the end 66 of the external bias connector 68 and it provides a desirable spring loading of the bias pin 68.

An adjustable short 72, which is designed to rest in groove 48, is threaded as shown into an opening 74 of a hollow cylindrical housing 76, and the short 72 has a somewhat enlarged end portion 78 thereon which fits snugly into the rectangular groove 48 in the frequency determining insert member 44. Thus, the end 78 of the short 72 may, if necessary, be adjustably positioned quite close to the diode package 42 in order to provide a degree of parallel tuning for the waveguide assembly. The exact nature of this tuning will be explained in more detail below with reference to the equivalent circuit of FIG. 5.

The cover member 34 includes a pair of openings or horizontal alignment passageways 80 and 82 which are utilized to align the member 34 with the housing 76. The cover member 34 also has an upright passageway 84 therein through which a locking screw 86 may be inserted and threadably secured as shown against the top surface of the movable short 72. This locking mechanism prevents any movement of the short 72 after the waveguide assembly has been tuned.

The short 72 extends as shown into the coaxial outer housing 76 where it is fastened to one end of the tuning screw 88. This screw 88 is in turn threaded into an inner sleeve 89 which sits tightly and coaxially within the housing 76, so that the right hand end of the screw 88 may be turned to move this screw 88 and the short 72 relative to both the housing 76 and to the waveguide groove 48. A locking nut 90 surrounds the end of the inner sleeve 89 and may be secured to the inner sleeve 89 by means of a small locking screw 92 which extends perpendicular to the axis of these latter members and through an opening in the nut 90 and into contact with the inner sleeve 89. Thus the nut 90 may be utilized to prevent any sliding movement between the sleeve 89 and the housing 76. Also, one or more smaller locking nuts 93 and 95 may be threaded onto the end of the tuning screw 88 and securely fastened against the end of the larger locking nut 90 to prevent any movement of the tuning screw 88 and thus the short 72 once the desired position of the latter has been set in accordance with the loading requirements for the oscillator or amplifier described.

Figure 3:
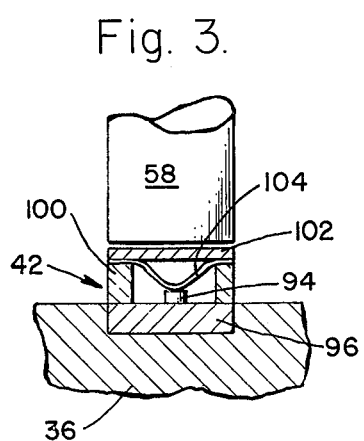
FIG. 3 is an enlarged cross-sectional view of the diode package and bias pin of FIGS. 1 and 2 above.

Referring now to FIG. 3, the diode package generally designated 42 includes an IMPATT diode 94 which is thermocompression bonded to a metallic header 96 which fits snugly within the cylindrical recess 38 of the heat sink 36 as previously described. The upper surface 98 of the header 96 is flush with the upper surface of the heat sink 36, and the microwaves or millimeter waves which are propagated along the groove 48 and in the waveguide opening between the adjacent members 44 and 36 see no electrical discontinuities at the diode package 42 on the upper surface of the heat sink 36. This feature is especially advantageous from the standpoint of minimizing spurious resonances in the waveguide assembly at millimeter-wave operation. The diode package 42 also includes a hollow ceramic (or quartz) cylinder 100 which surrounds the diode 94, as shown, and which is bonded, metal-to-ceramic (or quartz), to both the metallic header 96 and to an upper electrical contact 102. The diode 94 makes good ohmic electrical connection to this upper package contact 102 by means of a gold ribbon 104 which is thermocompression bonded to the IMPATT diode 94 prior to bonding the upper contact 102 to the ceramic cylinder 100. The flat upper contact 102 which is of a relatively large area enables good electrical contact to be made to the diode 94 by the cylindrical bias pin 58.

Figure 2:
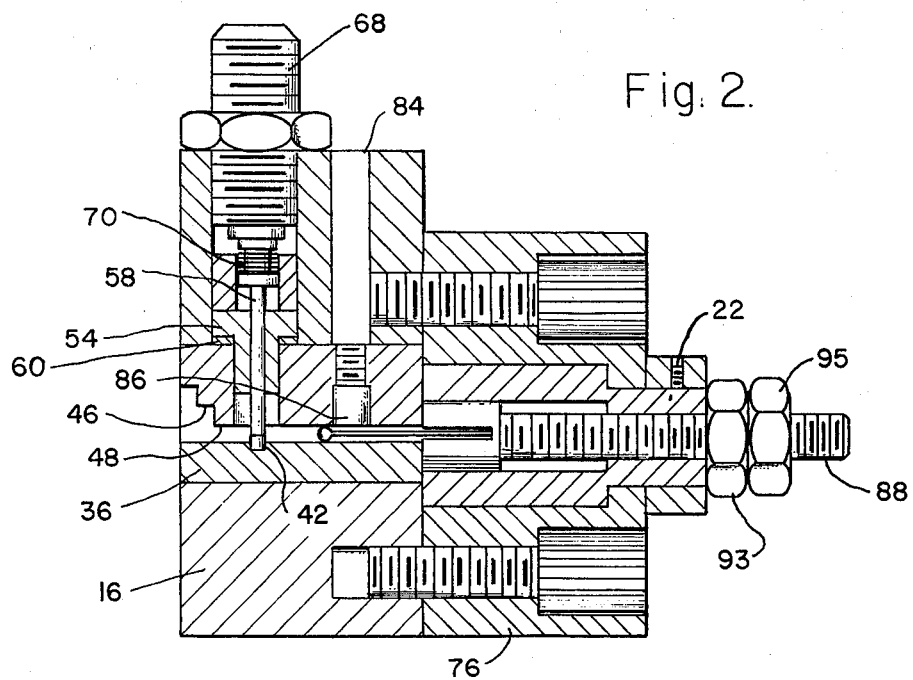
FIG. 2 is a cross-sectional view of FIG. 1 taken along lines 2—2 of FIG. 1.
Figure 4:
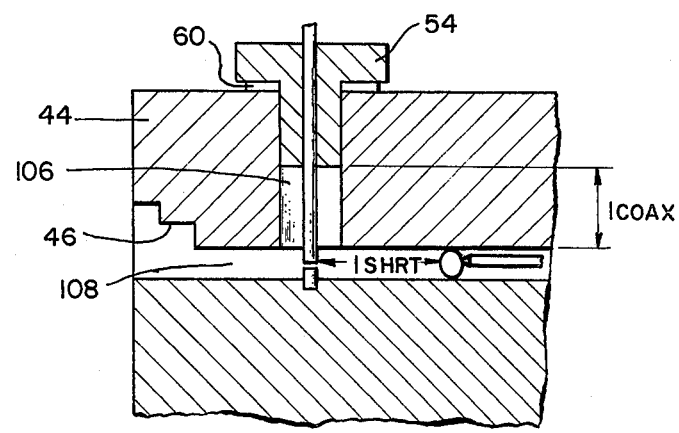
FIG. 4 is an enlarged cross-sectional view illustrating the critical tuning dimensions of the invention.
Figure 5:
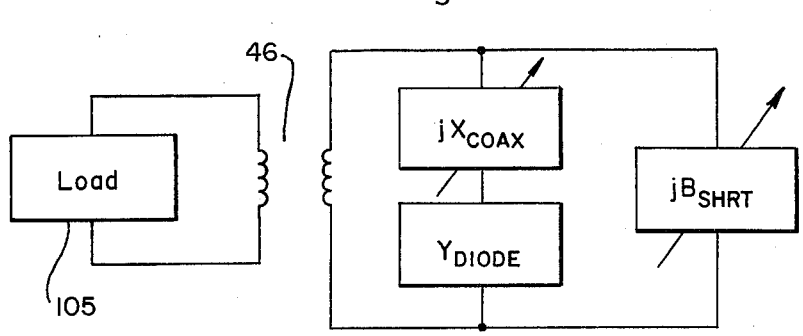
FIG. 5 is an equivalent circuit for the waveguide structure illustrated in the previous figures.

Referring now to FIGS. 4 and 5, the two variable circuit parameters $l_{SHRT}$ and $l_{COAX}$ defined in FIG. 5 are utilized to control the susceptance, $B_{SHRT}$, of the short 72, and the reactance, $X_{COAX}$, of the coaxial section and thereby vary the loading on the IMPATT diode 94. By turning the tuning screw 88 (FIG. 2), the short 72 can be very gradually moved horizontally toward or away from the diode package 42 to thus control $l_{SHRT}$. The distance $l_{COAX}$ can be varied by inserting one or more of the thin washers 60 on the order of 1–20 mils in thickness between the cap 54 of the coaxial section 52 and the top of the replaceable insert 44 as shown.

In order to more fully understand how the structure of FIG. 4 may be finely tuned by varying the parameters $jX_{COAX}$ and $jB_{SHRT}$ in FIG. 5, consider first the expression for the total impedance seen by the diode 94 which is given as:

$$Z_L = \frac{G_L}{G_L^2 + B_{SHRT}^2} + j\left(X_{COAX} - \frac{B_{SHRT}}{G_L^2 + B_{SHRT}^2}\right) \quad \text{Eq. (1)}$$

where $G_L$ is the external load admittance, which is equal to the waveguide admittance, $Y_{WG}$; $B_{SHRT}$ is the susceptance of the movable short 44; and $X_{COAX}$ is the reactance of the coaxial section 52, and $Y_{DIODE}$ is the admittance of the diode 94. The equivalent circuit for these waveguide circuit components is illustrated in FIG. 5, and the step transformer 46 therein couples this circuitry to the external load 105. The magnitudes of $X_{COAX}$ and $B_{SHRT}$ can be varied by adjusting the distances $l_{COAX}$ and $l_{SHRT}$, respectively. That is, $X_{COAX}$ is related to $l_{COAX}$ by the expression:

$$X_{COAX} = Z_{COAX} \tan(\beta_o l_{COAX}) \quad \text{Eq. (2)}$$

and $B_{SHRT}$ is related to $l_{SHRT}$ by the expression:

$$B_{SHRT} = Y_{WG} \cot(\beta_{WG} l_{SHRT}) \quad \text{Eq. (3)}$$

where $Z_{COAX}$ is the characteristic impedance of the cylindrical opening 106, and $\beta_o$ is the propagation constant of the TEM mode in the cylindrical opening 106. $Y_{WG}$ is the characteristic admittance of the reduced height waveguide section (opening) 108 of the assembly and $\beta_{WG}$ is the propagation constant of the $TE_{10}$ mode in the reduced height waveguide section 108. Thus, by varying $B_{SHRT}$ and $X_{COAX}$ as indicated, we are able to achieve a broad range of loading conditions for the IMPATT diode 94. We have obtained loaded Q values for this waveguide structure ranging from 5 for broadband amplification to greater than 300 for low noise oscillation, and we have successfully used the circuit described above in a broadband sweeper operating with a bandwidth from 10 GHz to 25 GHz at V-band and from 6 GHz to 10 GHz at Ka-band.

The interchangeable insert 44 contains, as mentioned, all of the frequency dependent elements of the circuit, viz., a reduced height waveguide section 108, an impedance transformer 46, and a cylindrical opening 106 which may be varied in diameter to change the frequency of operation. Thus, by interchanging only this one insert 44 (and the diameter of the cylindrical opening 106, if desired), the circuit can, for example, be used for one broad frequency range, such as from 50 GHz to 75 GHz using one insert 44, and for another higher frequency range from 75 to 110 GHz by using another insert 44. Thus, the feature of the removable insert 44 makes it possible to vary the operating frequency ranges at a very low cost.

Summarizing, therefore, the significant and novel features of the present invention include the combination of an adjustable coaxial RF filter section 52 and a movable short 72 to provide two degrees of freedom in tuning the circuit, which tuning provides a broad range of loading conditions for the IMPATT diode 94. Secondly, the interchangeable insert 44 contains all of the frequency dependent elements of the circuit and enables the circuit to be operated over a broad frequency range covering frequencies from 50 GHz to 110 GHz. Thirdly, the device package 42 is mounted in such a manner that the diode header 96 electrically constitutes part of the waveguide section 36 and thereby minimizes electrical discontinuities and spurious mode resonances at millimeter wave frequencies. Fourthly, the mounting of the diode package 42 as described provides good heat sinking for the IMPATT diode 94, and finally, the coaxial section 52 may be displaced at finely controllable varying distances from the diode 94 by means of one or more thin spacers 60. This tuning technique eliminates the critical rotation normally associated with tuning screws of the prior art structures which are threaded through one wall of a waveguide.

What is claimed is:

1. A tunable microwave structure for sustaining oscillations or achieving amplifications, including in combination:
   a. a hollow waveguide structure,
   b. a negative resistance diode mounted adjacent one wall of said hollow waveguide structure;
   c. said structure having an opening in another wall thereof through which a DC bias connector is centrally disposed and makes electrical contact to said diode for providing a DC bias voltage thereto; and
   d. filter means comprising a hollow member coaxial with said bias connector and disposed thereon within said opening, said member and said opening in said waveguide structure defining a cavity around said DC bias connector, whereby the position of said member on said connector establishes the loading on said diode and said bias connector serves as both the DC electrical connection for said diode and a slide member for said filter.

2. The structure defined in claim 1 which further includes a movable short mounted adjacent said diode and adjustable in a direction mutually perpendicular to the logitudinal axis of said DC bias connector, whereby said short and said filter provide series and parallel tuning, respectively, for said structure.

3. The structure defined in claim 1 which further includes at least one hollow spacer mounted between said filter means and an outer wall surface of said waveguide structure for closely controlling the spacing between one end of said hollow member and said diode.

4. The structure defined in claim 3 which further includes a movable short in said waveguide structure and adjacent said diode, said short adjustable in a direction mutually perpendicular to the longitudinal axis of said DC bias connector, whereby both series and parallel tuning are provided for said diode.

5. The structure defined in claim 4 wherein said hollow member has a T-shaped configuration and rests on said spacers, and said DC bias connector passes through the vertical leg of said T-shaped configuration.

6. In a microwave or millimeter wave oscillator or amplifier having a negative resistance diode mounted on one wall of a waveguide structure and serially connectable via a bias pin to a DC supply, the improvement comprising: a hollow filter member positioned in an opening in a waveguide wall of said structure opposite said wall on which said diode is mounted and slidable on said bias pin toward and away from said diode for varying the series loading on said diode, whereby the size and number of parts necessary to accomplish such loading is minimized.

7. The invention defined in claim 6 wherein said hollow filter member has an insulating film of anodized aluminum, $Al_2O_3$, thereon for providing a DC insulation between said bias pin and said waveguide structure, whereby said filter member, said film thereon and said waveguide structure also serve as plates of an RF filter capacitor for shunting RF from the DC bias supply.

8. The invention defined in claim 6 wherein the waveguide wall receiving said hollow filter member comprises:
   a. a frequency dependent replaceable insert having an opening therein through which said bias pin and said filter member pass and utilized for confining microwave or millimeter wave energy to predetermined paths in said circuit; and
   b. said insert having a transformer at one end thereof for matching the impedance of the diode to that of an external load and further having a groove extending from said transformer to the other end of said inert; the depth of said groove and the configuration of said transformer setting the operating frequency of said circuit, whereby said insert may be easily removed and replaced to accomplish a wide range of tuning at a minimum cost.

9. The invention defined in claim 8 wherein:
   a. said transformer is a reduced height step transformer,
   b. said groove has a rectangular cross-section and serves as one waveguide propagating surface of said circuit, and
   c. a movable short is selectively positioned within said groove and slidable therein toward and away from said diode to provide the variable parallel loading on said diode, whereby said circuit exhibits two degrees of series and parallel tuning for said diode.

10. In a microwave or millimeter wave oscillator or amplifier having a negative resistance diode mounted adjacent one wall of a waveguide structure and serially connected via a bias pin to a DC supply terminal, the improvement comprising:
   a. a hollow RF filter member slidable on said bias pin for varying the series loading on said diode as a function of the distance between said diode and one end of said filter member,
   b. a replaceable insert having an opening therethrough for receiving said filter member and said bias pin and serving to confine microwave or millimeter wave energy propagation within said circuit to a predefined path,
   c. at least one spacer between said filter member and one wall of said insert for controlling said distance in (a) above,
   d. said insert having a transformer configured in one end thereof for matching the impedance of said diode to that of an external load and further having a groove of predefined cross-section extending from said transformer to the other end of said insert, and
   e. a parallel short positioned in said groove and movable toward and away from said diode for varying the parallel loading thereon, whereby both the parallel and series loading on said diode may be varied to tune said oscillator or amplifier over a wide frequency range.

11. The oscillator defined in claim 10 wherein said filter member has an insulating film of anodizoed aluminum, Al O, thereon for providing a DC insulation between said filter member and said waveguide structure, whereby said filter member, said film and said waveguide structure also serve as plates of an RF filter capacitor for shunting RF energy from said DC bias supply terminal.

12. The oscillator defined in claim 11 wherein said filter member has a T-shaped configuration and rests on one or more of said spacers, and said DC bias connector passes internally through the vertical leg of said T-shaped configuration.

* * * * *